United States Patent
Pullini et al.

(10) Patent No.: US 7,268,543 B2
(45) Date of Patent: Sep. 11, 2007

(54) DEVICE FOR DETECTING MAGNETIC FIELDS AND RELATED DETECTING METHODS

(75) Inventors: Daniele Pullini, Orbassano (IT); Anatolii Zvezdine, Orbassano (IT); Konstantyne Zvezdine, Orbassano (IT); Brunetto Martorana, Orbassano (IT); Piero Perlo, Sommariva Bosco (IT); Piermario Repetto, Turin (IT)

(73) Assignee: C.R.F. Societa Consortile per Azioni, Orbassano (Turin) (IT)

( * ) Notice: Subject to any disclaimer, the term of this patent is extended or adjusted under 35 U.S.C. 154(b) by 109 days.

(21) Appl. No.: 10/535,943

(22) PCT Filed: Sep. 15, 2004

(86) PCT No.: PCT/IB2004/003056

§ 371 (c)(1),
(2), (4) Date: May 24, 2005

(87) PCT Pub. No.: WO2005/029108

PCT Pub. Date: Mar. 31, 2005

(65) Prior Publication Data

US 2006/0049828 A1    Mar. 9, 2006

(30) Foreign Application Priority Data

Sep. 23, 2003   (IT) .......................... TO2003A0729

(51) Int. Cl.
*G01R 33/02* (2006.01)
(52) U.S. Cl. ..................................... 324/252; 324/249
(58) Field of Classification Search ................ 324/252, 324/244, 249; 257/421–422, 425; 438/3
See application file for complete search history.

(56) References Cited

U.S. PATENT DOCUMENTS

| 6,104,189 A | 8/2000 | Allenspach et al. |
| 6,744,662 B2 * | 6/2004 | Freitag et al. ............... 365/158 |
| 2002/0003685 A1 | 1/2002 | Takahashi et al. |
| 2002/0012206 A1 * | 1/2002 | Kanno ........................ 360/322 |

OTHER PUBLICATIONS

International Search Report published with WO 2005/029108.

* cited by examiner

*Primary Examiner*—Bot LeDynh
(74) *Attorney, Agent, or Firm*—Nixon & Vanderhye P.C.

(57) ABSTRACT

A device for detecting magnetic fields, of the type comprising at least one element made of hard 5 magnetic material (12) and an element made of soft magnetic material (13) associated an element made of semiconductor material (11), electrodes (15) for forcing a current (I) in the semiconductor material (11), characterised in that the element made of hard magnetic material (12) and element made of soft magnetic material (13) are positioned in planar fashion on the element made of semiconductor material (11).

15 Claims, 2 Drawing Sheets

DEVICE FOR DETECTING MAGNETIC FIELDS AND RELATED DETECTING METHODS

This application is the US national phase of international application PCT/IB2004/003056 filed 15 Sep. 2004 which designated the U.S. and claims benefit of IT TO2003A000729, dated 23 Sep. 2003, the entire content of which is hereby incorporated by reference.

The present invention relates to a device for detecting magnetic fields, of the type comprising an element made of hard magnetic material and an element made of soft magnetic material associated to an element made of semiconductor material, means for forcing a current in said semiconductor material.

According to the state of the art, to detect magnetic fields, magneto-resistive sensors are employed, i.e. devices whose resistance to the passage of the electrical current varies with variations in the magnetic field whereto they are subjected. In particular, magnetic sensors called AMR (Anisotropic Magneto Resistance) are known; they are usually obtained by means of a thin film of iron-nickel (permalloy), plated onto a silicon wafer and shaped in the form of a resistive strip.

The application of an external magnetic field determines a change in the orientation of magnetisation in the permalloy, making it not parallel to the current that flows in the resistive strip and thereby increasing resistance. Said AMR sensors change their resistance by 2-3% in the presence of magnetic fields. In order effectively to appreciate the change in resistance, the AMR sensors are thus laid in such a way as to form a Wheatstone bridge.

However, the change in resistance is linked to the occurrence of the magneto-resistive effect, present in a limited quantity of materials similar to permalloy.

Moreover, such sensors are not easy to integrate and miniaturise and involve costly plating processes.

Also known are magnetic devices of the so-called 'spin valve' type, which provide a vertical stack of layers in which, in a simplified embodiment, between a layer of hard magnetic material and a layer of soft magnetic material is positioned a spacer layer made of dielectric or conductor material. The spin valve has a sharp reduction in electrical conducibility if a magnetic field is applied in the opposite direction to the magnetisation of the layer made of hard magnetic material.

However, said spin valve device has a complex structure to construct.

The object of the present invention is to provide a device for detecting magnetic field able to have an increased sensitivity and a better ease of integration in simple plating processes at reduced cost.

According to the present invention, said object is achieved thanks to a device for detecting magnetic fields and to a corresponding detecting method having the characteristics specifically set out in the claims that follow.

The invention shall be described with reference to the accompanying drawings, provided purely by way of non limiting example, in which:

FIG. 5 shows, in diagram form, a third variant to the device for detecting magnetic fields of FIGS. 1A and 1B;

Figure 1A:
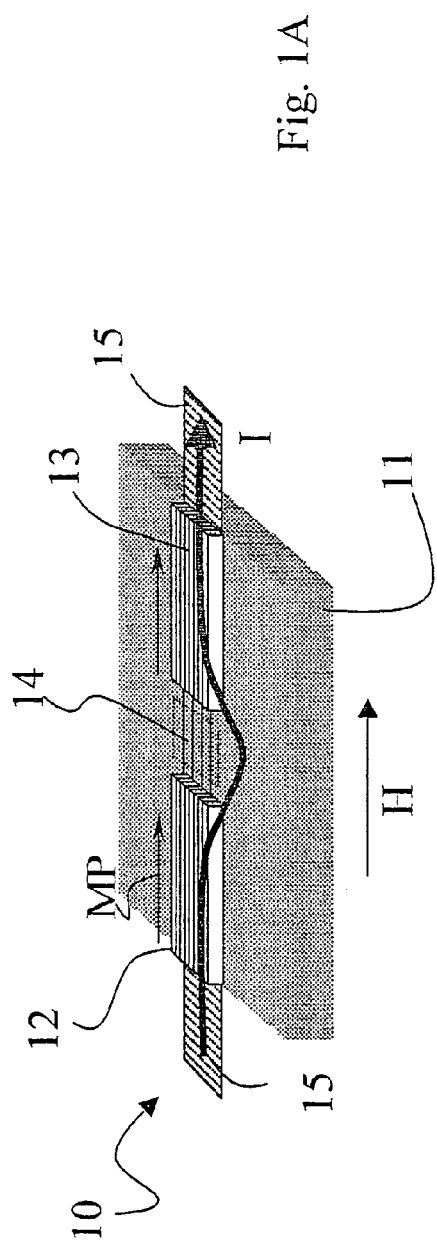
FIGS. 1A and 1B show, in diagram form, two different operating states of a device for detecting magnetic fields according to the invention.

FIG. 1A shows a device for detecting magnetic fields globally designated by the reference number 10. Said device 10 comprises a substrate 11 made of semiconductor material, e.g. silicon. A first strip 12, made of a hard ferromagnetic material, such as nickel-iron-cobalt or rare earth alloy, is plated onto the substrate 11 of semiconductor. Said first strip 12 has an elongated parallelepiped shape, and a permanent magnetisation is associated to it, represented in FIG. 1A by a vector MP. Facing said first strip 12, along its shorter side, is positioned a second strip 13, also with elongated parallelepiped shaped, made of a soft ferromagnetic material, such as iron or permalloy.

The first strip 12 and the second strip 13 therefore identify between them a region 14 of substrate 11, which distances them from each other.

A current designated as I in FIG. 1A is forced by means of electrodes 15 applied to the first strip 12 and to the second strip 13, so the path of the current I also includes the region 14 of semiconductor substrate 11. To the contacts 15 is associated a generator of the current I, as well as means for measuring the variation in the resistance of the circuit, which are not shown in the figures.

FIG. 1A shows a first operating state of the device 10 in which an external magnetic field H is applied parallel and concordant to the direction of permanent magnetisation and to the sense of the current I in the semiconductor substrate 11.

When the external magnetic field H is concordant with the direction and sense of magnetisation of the first strip 12 of hard magnetic material 12, the electrical resistance of the region 14 is low.

Figure 1B:
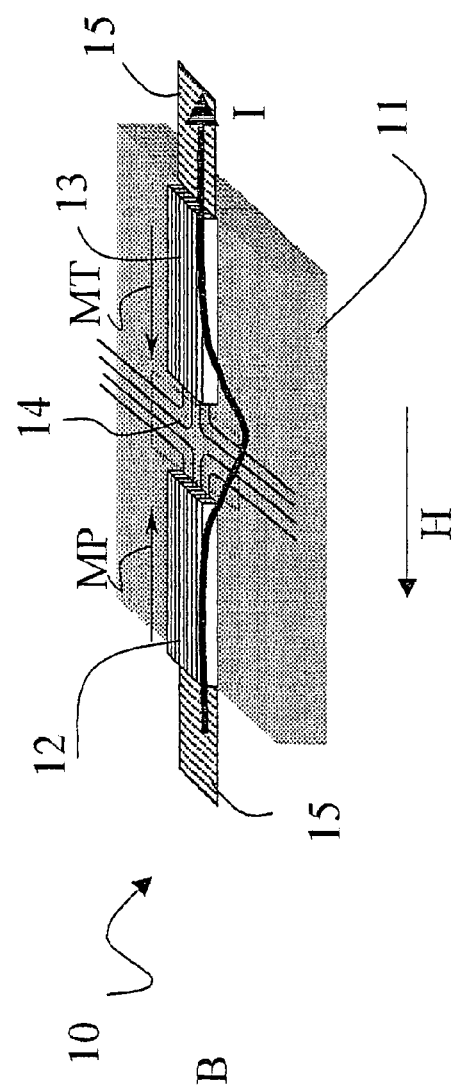

When the external magnetic field H has opposite sense, as shown in FIG. 1B, and hence in the second strip of soft magnetic material 13 is induced a temporary magnetisation MT with opposite sense to the permanent magnetisation MP, the device 10 has the greatest electrical resistance. As FIG. 1B shows, the field lines, under the effect of the anti-parallel magnetic field H, tend to extend to regions surround the region 14, influencing the mobility of the semiconductor substrate 11 and thereby increasing total resistance.

The effect described above tends to be semi-superficial, i.e. it usually involves a layer with a depth of a hundred nanometres, with strong analogies with two-dimensional electronic gases. In this regard, it is possible to construct the substrate 11 in the form of hetero-structure with two-dimensional bordering, to improve the characteristics of sensitivity of the device for detecting magnetic fields 10.

GaAs and AlGaAs based hetero-structures can be used in which the various epitaxial layers continuously vary their stoichiometry. For example, one can start by plating a layer of GaAs and, during the growth, lay Al in increasing concentrations until reaching the desired final stoichiometry of AlGaAs. The stoichiometric ratios of As and Ga can also change during growth.

The device for detecting magnetic fields 10 shown in FIGS. 1A and 1B can therefore comprise a substrate 11 constituted by a semiconductor material like Si, Ge, InSb, Hg(Cd)Te, InAs, TiC, GaAs, SiC, GaP, GaN, or a AlGaAs/GaAs hetero-structure or a combination of said semi-conductor materials and metal parts of one or more metals. In a preferred version of the invention, a semiconductor with high electronic mobility such as InSb is used.

The semiconductor constituting the substrate 11 can be laid onto any other substrate, for example silicon or glass, by continuous or pulsed electrical plating, electrochemical methods, simple precipitation, centrifuging, thermal evaporation or electron beam, simple or magnetron sputtering, CVD, PECVD, serigraphy.

The thickness of the semiconductor substrate 11 can range from one nanometre to some hundreds of micrometres.

On the semiconductor substrate 11 the first strip of hard magnetic material can be obtained from a hard magnetic alloy such as CoNi80Fe20, whilst the second strip 13 of soft magnetic material can be made, by way of example, of permalloy. Clearly, the person versed in the art may alternatively use many other different materials, able to have a respectively hard or soft magnetic behaviour, such as ferromagnetic alloys with different stoichiometric compositions, Ni, Fe, Co, or rare earth metals. These materials can be plated by plating methods such as continuous or pulsed electroplating, electrochemical methods, simple precipitation, centrifuging, thermal or electron beam evaporation, simple or magnetron sputtering, CVD, PECVD.

Figure 2:
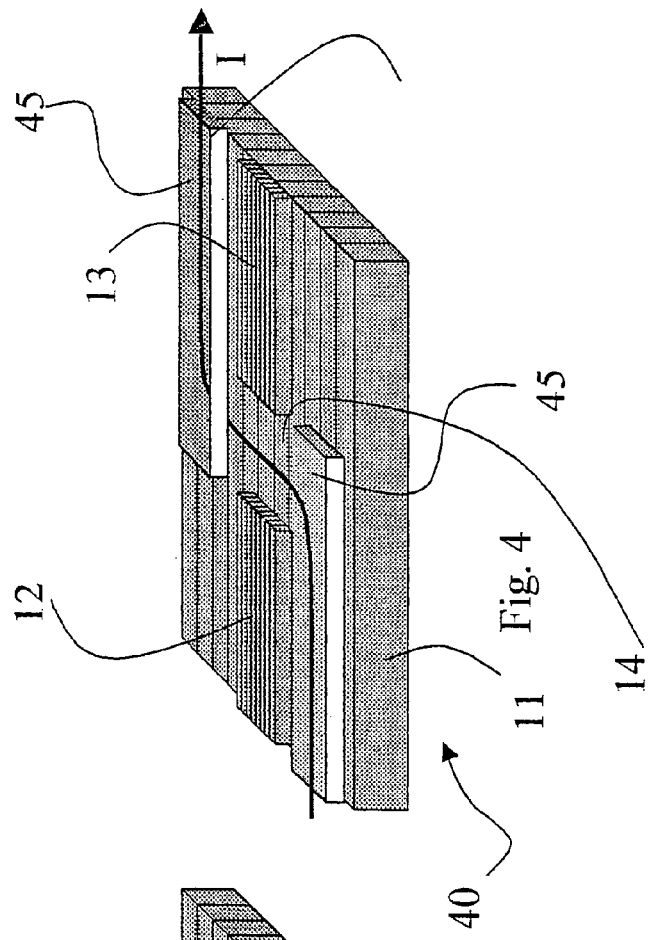
FIG. 2 shows, in diagram form, a variant to the device for detecting magnetic fields of FIG. 1A

FIG. 2 shows a device for detecting magnetic fields 20, variant to the device 10 of FIGS. 1A and 1B, in which the first strip 12 and the second strip 13 are obtained by means of multiple plating of metal layers, as an alloy or as a sandwich of layers. Moreover, instead of the region 14 of semiconductor, there is a layer of polymer 24 which incorporates clusters of metallic or semiconductor atoms. This polymer can be insulating, conjugated or conductor, or also a light emitter. The metal clusters can also be plated directly onto the region 14 shown in FIGS. 1A and 1B, without incorporating in the polymer layer 24, with methods such as continuous or pulsed electroplating, electrochemical methods, simple precipitation, centrifuging, thermal or electron beam evaporation, simple or magnetron sputtering, CVD, PECVD or another apparatus for the formation and controlled laying of clusters.

In the fabrication of the devices 10 and 20 the first strip 12 and the second strip 13 can be geometrically defined using photolithography techniques, or by means of electronic or ionic beam.

The first strip 12 and the second strip 13 must be separated by a distance which can vary from a few angstrom and hundreds of micrometres.

The dimensions such as thickness and width of the metal strips can also vary from one nanometre to hundreds of micrometres.

In a possible variant, the magnetisation state of the first strip 12 and of the second strip 13 can be induced by means of permanent magnets or by the passage of electrical current on two tracks that are orthogonal to the strips. Said electrical tracks for the magnetisation of the metallic strips such as the first strip 12 and the second strip 13 can be obtained over the strips and also obtained by photolithography. The electrical tracks for the magnetisation of the metal strips are electrically insulated from the metal strips.

The electrical insulation between the metal strips and the magnetisation tracks is obtained by plating any layer of electrically insulating material, for example oxide or ceramic material.

Said first strip 12 and second strip 13 in a possible alternative embodiment can be plated in two windows dug by etching in the semiconductor substrate 11. The etching process can be executed by photolithography, by means of electronic or ionic beam or nano-imprinting.

Figure 3:
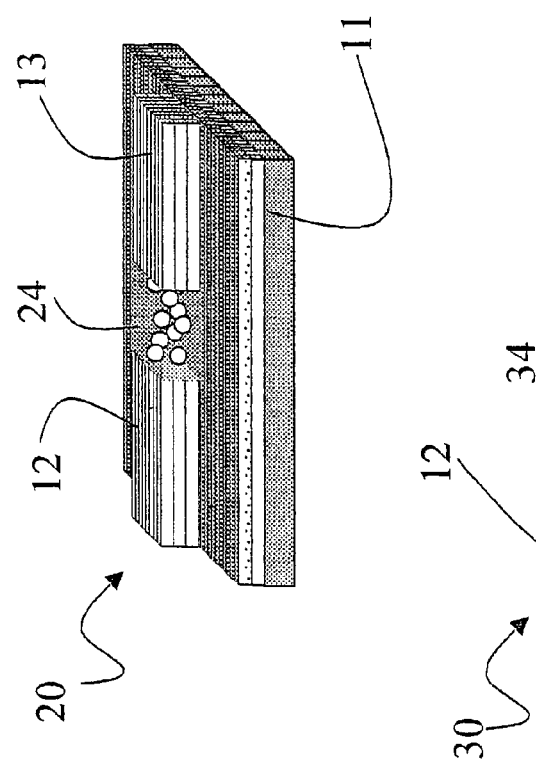
FIG. 3 shows, in diagram form, a first variant to the device for detecting magnetic fields of FIGS. 1A and 1B.

FIG. 3 shows a device for detecting magnetic fields 30 which constitutes and additional embodiment of the device according to the invention.

Said device 30 comprises, plated onto the semiconductor substrate 11, two first strips 32 made of hard ferromagnetic material, interspersed by a second strip 33 of soft magnetic material, so between the two first strips 33 and the second strip 34 are defined two regions 34 of free substrate 11.

The second strip 33 constitutes an insulated platelet which provides the sensitive element to the external magnetic field and can have any geometric shape and dimensions. The sensitivity of the device depends on the geometric parameters of said platelet or second strip 33.

Figure 4:
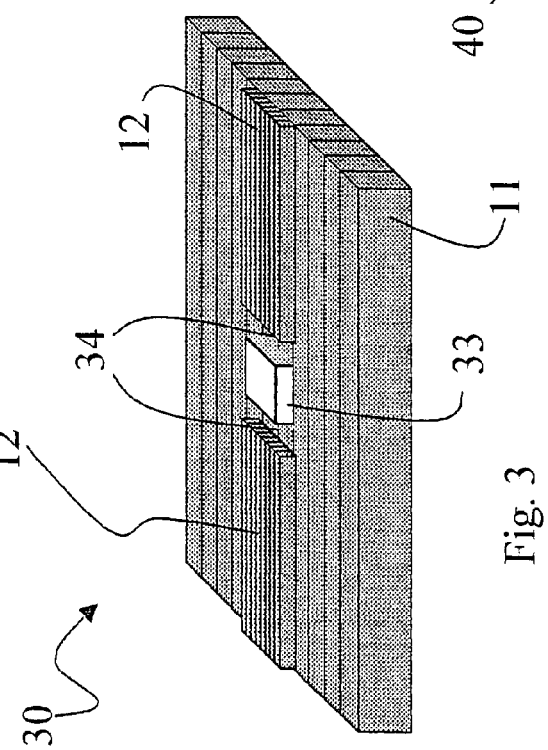
FIG. 4 shows, in diagram form, a second variant to the device for detecting magnetic fields of FIGS. 1A and 1B.

FIG. 4 shows a device for detecting magnetic fields 40 which constitutes an additional embodiment of the device according to the invention, in which the current flows in orthogonal direction relative to the axis of magnetisation. For this purpose, electrodes 45 for applying the current I to the substrate 11 are plated along an axis that is orthogonal to the one defined by the first strip 12 and by the second strip 13.

The solution described above enables to achieve considerable advantages with respect to prior art solutions.

The device of the invention, using a planar geometry, is advantageously simple to construct, by means of not very expensive technologies, whilst obtaining a high sensitivity.

Naturally, without altering the principle of the invention, the construction details and the embodiments may vary widely from what is described and illustrated purely by way of example herein, without thereby departing from the scope of the present invention.

A device for detecting magnetic fields comprising an element made of hard magnetic material and an element made of soft magnetic material associated to an element made of semiconductor material, means for forcing a current in said semiconductor material, where said element made of hard magnetic material and element made of soft magnetic material are positioned in planar fashion on said element made of semiconductor material can be used as a magnetic field sensor or magnetic switch, as a sensor of electromagnetic radiation, as an emitter of electromagnetic radiation, as a photovoltaic cell, and as a thermo-photovoltaic cell.

The invention claimed is:

1. A device for detecting magnetic fields, of the type comprising at least one element made of hard magnetic material and an element made of soft magnetic material associated to an element made of semiconductor material, means for forcing a current in a region of said semiconductor material,
   wherein said element made of hard magnetic material and said element made of soft magnetic material and said means for forcing a current are respectively positioned in a planar geometry on said element made of semiconductor material, and said element made of hard magnetic material is configured for applying a permanent magnetization in said region of semiconductor material parallel to the plane of said semiconductor material.

2. A device as claimed in claim 1, wherein said element made of hard magnetic material is distanced relative to said element made of soft magnetic material to define said region of semiconductor material.

3. A device as claimed in claim 1, wherein said region of semiconductor material comprises polymeric material that incorporates clusters of metallic or semiconductor atoms.

4. A device as claimed in claim 3, wherein said polymeric material is plated onto said region of semiconductor material of the substrate.

5. A device as claimed in claim 2, wherein comprises at least two elements made of hard magnetic material positioned around an element of soft magnetic material and defining at least two semiconductor regions.

6. A device as claimed in claim 1, wherein said element made of hard magnetic material and/or said element made of soft magnetic material comprise multiple layers.

7. A device for detecting magnetic fields as claimed in claim 1, wherein said at least one element made of hard magnetic material and one element made of soft magnetic material are plated in windows dug by etching into the semiconductor substrate.

8. A device as claimed in claim 1, wherein the means for forcing a current in said semiconductor material comprise metallic contacts.

9. A device as claimed in claim 8, wherein said metallic contacts are positioned in substantially perpendicular fashion relative to an axis defined by said at least one element made of hard magnetic material and one element made of soft magnetic material.

10. A device as claimed in claim 1, wherein said at least one element made of hard magnetic material comprises a hard ferromagnetic alloy, and the element made of soft magnetic material comprises permalloy.

11. A device as claimed in claim 1, wherein said substrate is obtained by means of at least one semiconductor selected among Si, Ge, InSb, Hg (Cd) Te, InAs, TiC, GaAs, SIC, GaP, GaN.

12. A device as claimed in claim 1, characterised in that wherein said substrate is obtained in the form of hetero-structure with two-dimensional bordering.

13. A method for detecting magnetic fields, of the type providing at least one element made of hard magnetic material, associated to a permanent magnetisation and one element made of soft magnetic material associated to a temporary magnetisation induced by an external magnetic field wherein it further comprises the operations of:

arranging the element of hard magnetic material and the element of soft magnetic material in such a way that the respective temporary magnetisation and permanent magnetisation lie substantially in one plane;

forcing a current in a region of semiconductor material in said plane located between said element of hard magnetic material and element of soft magnetic material;

measuring the value of resistance in said region of semiconductor material according to the values assumed by an external magnetic field.

14. A device as claimed in claim 10, wherein the hard ferromagnetic alloy is CoNi80Fe20.

15. A device as claimed in claim 12, wherein the hetero-structure is a GaAs/AlGaAs hetero-structure.

* * * * *